United States Patent
Hermansson et al.

[19]

[11] Patent Number: 6,104,043
[45] Date of Patent: Aug. 15, 2000

[54] SCHOTTKY DIODE OF SIC AND A METHOD FOR PRODUCTION THEREOF

[75] Inventors: Willy Hermansson, Västerås; Bo Bijlenga, Skultuna; Lennart Ramberg, Bromma; Kurt Rottner, Kista; Lennart Zdansky, Västerås; Christopher Ian Harris, Sollentuna; Mietek Bakowski, Skultuna; Adolf Schöner, Kista; Nils Lundberg, Uppsala; Mikael Östling, Spånga; Fanny Dahlquist, Stockholm, all of Sweden

[73] Assignee: ABB Research Ltd., Zurich, Switzerland

[21] Appl. No.: 08/803,380

[22] Filed: Feb. 20, 1997

[51] Int. Cl.⁷ .................. H01L 31/0312; H01L 29/74; H01L 27/095
[52] U.S. Cl. .................. 257/77; 257/155; 257/156; 257/478
[58] Field of Search .................. 257/77, 155, 156, 257/478, 603, 604, 605

[56] References Cited

PUBLICATIONS

Baliga, Analysis of Junction–Barrier–Controlled Schottky (JBS) Rectifier Characteristics, Solid State Electronics, vol. 278, No. 11, pp. 1089–1093, 1985.

Chang et al., High–Current, Low–Forward–Drop JBS Power Rectifiers, Solid State Electronics, vol. 29, No. 3, pp. 359–363, 1986.

Hower et al., The SPIN Rectifier, A New Fast–Recovery Device, PESC '88 Record, Apr. 1988, pp. 709–717.

Mehrotra et al., Low Forward Drop JBS Rectifiers Fabricated Using Submicron Technology, IEEE Transactions On Electron Devices, vol. 41, No. 9, Sep. 1994, pp. 1655–1660.

Kim et al., Low–Loss Schottky Rectifier Utilizing Trench Sidewall as Junction–Barrier–Controlled Schottky Contact, Jpn. J. Appl. Phys., vol. 34 (1995), pp. 913–916, Part 1, No. 2B, Feb. 1995.

Baliga, Trends In Power Semiconductor Devices, IEEE Transactions ON Electron Devices, vol. 43, No. 10, Oct. 1996, pp. 1717–1731.

*Primary Examiner*—Tom Thomas
*Assistant Examiner*—Ori Nadav
*Attorney, Agent, or Firm*—Pollock, Vande Sande & Amernick

[57] ABSTRACT

A Schottky diode of SiC has a substrate layer, a drift layer and emitter layer regions formed in the drift layer. A metal layer makes an ohmic contact to the emitter layer regions and Schottky contact to the drift layer. A depletion of the drift layer region between two adjacent emitter layer regions is allowed in the blocking state of the diode making the two adjacent p-type emitter layer regions form a continuous depleted region therebetween in this state.

10 Claims, 2 Drawing Sheets

SCHOTTKY DIODE OF SIC AND A METHOD FOR PRODUCTION THEREOF

TECHNICAL FIELD

The present invention relates to a Schottky diode having the following layers on top of each other in the order mentioned: a substrate layer highly doped according to a first conductivity type, n or p, a drift layer low doped according to the first conductivity type, both layers made of SiC, and a metal layer making a Schottky contact to the drift layer. An advantage of such a Schottky diode with respect to a pn-diode is a lower voltage drop and thereby lower on-state losses. Furthermore in a Schottky diode there is, due to primarily majority carrier conduction, no real reverse recovery behaviour on turning off and forward voltage overshoot on turning on and thereby reduced switching losses compared to the pn-diode making it well suited for use in converter circuits. However, as compared with pn-diodes, practical Schottky diodes suffer from high leakage currents, hard to accept in high power applications, when the Schottky junction is exposed to a high field.

SiC has some excellent physical properties, such as a high thermal stability, and thus devices fabricated from SiC can operate at high temperatures, namely up to 1000° k., a high thermal conductivity, so that SiC devices may be arranged at a high spatial density, and a high breakdown field being approximately ten times higher than for Si. These properties make SiC well suited as a material for high power devices operating under conditions where high voltages may occur in the blocking state of the device. would be highly desired to provide Schottky diodes of SiC with the disadvantages thereof according to above substantially reduced making them an especially attractive option for high power applications. Due to the large bandgap of SiC a Schottky diode made of this material has particular advantages with respect to on-state losses compared to a pn-diode made of SiC material, since the forward voltage drop of a pn-junction is very large for SiC as compared to for example Si. Furthermore, presently realized Schottky diodes of SiC show a very high leakage current in the blocking mode, much higher than theoretically expected. Another problem with conventional SiC Schottky diodes is that the maximum electric field is always close to the surface (in the Schottky barrier-region) and the quality of the interface must be very good. Field-concentrations can also appear, especially at the device periphery, and these field-concentrations lead to leakage currents which are unacceptable in some applications.

SUMMARY OF THE INVENTION

The object of the present invention is to provide a Schottky diode of SiC having improved properties with respect to already known SiC Schottky diodes. This object is according to the invention obtained by providing such a diode, which also comprises emitter layer regions highly doped according to a second conductivity doping type, n or p, and opposite to the first type and formed in the drift layer at a vertical distance from the substrate layer and making an ohmic contact to the metal layer, the regions being laterally separated from each other by drift layer regions. The doping concentrations of the drift layer and the emitter layer regions, the depths of the emitter layer regions with respect to the location of the Schottky contact between two adjacent emitter layer regions and the lateral distance between these are selected to make the depletion of the drift layer in the blocking state form a continuous depleted region between the emitter layer regions and thereby screening off the high electrical field at the Schottky junction, which by thus will not be exposed to high electrical fields.

In this way it will be possible to benefit from the advantages of the Schottky diode with respect to the pn-diode and conversely. At forward voltages well below the built-in potential of the pn junction the diode will act as a Schottky diode conducting higher currents at lower voltage drop and thereby having lower on-state losses. Thus, it is relied on transport across the Schottky barrier in the forward direction, while in the blocking state the depletion regions of the pn-junction formed by the emitter layer regions will join each other, pinching off the Schottky region and exposing it only to a low field even at high reverse bias voltages resulting in acceptably low leakage currents also at such high reverse bias voltages due to the pn-type behaviour in the blocking states. The advantages of this type of Schottky diode with respect to a conventional Schottky diode are that diodes which have to block high voltages in the reverse direction can be given a lower leakage current and there will be a lower on-resistance and thereby lower losses at higher current densities by carrier injection from the highly doped emitter layers. Compared with a conventional pn-diode this type of Schottky diode will have the advantage of a lower forward voltage drop at lower current densities, a lower reverse recovery charge and thereby lower switching losses at higher frequencies. A Schottky diode of the present invention has particular advantages when made of silicon carbide, since this material has a large bandgap causing a high pn-diode voltage drop in the forward direction which makes the Schottky diode character very interesting for low current densities in this direction, while the Schottky barriers are easily made high with little leakage at low fields.

According to a preferred embodiment of the invention the diode comprises at least one trench etched into the drift layer at the location of an emitter layer region. The this emitter layer region forms the bottom of the trench, and the metal layer forms an ohmic contact to the emitter layer region at the bottom of the trench creating a vertical distance between the Schottky contact next to the emitter layer region and the ohmic contact to the emitter layer region in the bottom of the trench. Such a trench results in a comparatively great vertical distance between the emitter layer region and the Schottky contact, so that it is be easier to deplete the drift layer region between two adjacent emitter layer regions than with a emitter layer region closer to the Schottky contact. High fields causing leakage currents may also be kept away from the Schottky contact.

According to another preferred embodiment of the invention the emitter layer region forming the bottom of the trench also forms the walls thereof, which facilitates the depletion of the drift layer region between two adjacent emitter layer regions for pinching off the Schottky region in the reverse blocking state of the diode.

According to another preferred embodiment of the invention the emitter layer region under the trench extends further laterally than the bottom of the trench at least in one direction. Such a diode may be produced without using very delicate lithography and etching techniques with a high resolution, since adjacent trenches may have a comparatively large lateral distance therebetween, but adjacent emitter layer regions may still be so close to each other that the drift layer region therebetween may easily be depleted in the reverse blocking state of the diode.

According to another preferred embodiment of the invention the emitter layer regions are formed by highly doped bars extending substantially laterally in substantially the same plane and crossing each other to form a bar pattern. The advantage of such a structure is that a metal layer does not have to form an ohmic contact to each emitter layer region, since these have a high conductivity due to the high doping concentration and they are in contact with each other, so that ohmic contacts thereto may be formed at some selected locations.

According to a preferred embodiment of the invention being a further development of the embodiment last mentioned the bar pattern is buried in the drift layer at a vertical distance to the Schottky contacts of the diode, and at least one trench is etched into the drift layer to obtain a metal on top of one emitter layer region there and thus an ohmic contact of the metal to all emitter layer regions. Thanks to a bar pattern such trenches may be etched at selected locations having a large mutual distance so that no delicate lithography is required.

According to another preferred embodiment of the invention the trench has a substantially continuous extension forming a frame extending close to the periphery of the bar pattern. As a result it is possible to establish an ohmic contact to all emitter layer regions in such a diode through a single trench substantially surrounding the diode.

According to the invention, there is also proposed a method for producing a junction barrier Schottky diode of SiC comprising the steps of:

1) epitaxially growing on top of each other the following semiconductor layers of SiC: a substrate layer being highly doped according to a first conductivity type, n or p, and a drift layer being low doped according to said the first conductivity type, 2) introducing dopants of a second conductivity doping type, n or p, opposite to the first conductivity type, into the drift layer in regions laterally spaced to form highly doped emitter layer regions in the drift layer at a vertical distance from the substrate layer, 3) applying a metal layer on top of the drift layer to make a Schottky contact thereto and on top of at least one of the emitter layer regions to make an ohmic contact thereto.

The ohmic contact and Schottky contact are connected together and form the anode of the diode, and the doping concentrations of the drift layer and the emitter layer regions, the depths of the emitter layer regions with respect to the location of the Schottky contact between two adjacent emitter layer regions and the lateral distance between them are selected to make the depletion of the drift layer in the blocking state form a continuous depleted region between the emitter layers thereby screening off the high electrical field at the Schottky junction, which by this will not be exposed to high electrical field.

This method makes it possible to produce a high quality diode of this type in SiC, although the critical processing steps, such as diffusion, are missing in SiC. The use of the implantation technique to form the emitter layer regions will make it possible to achieve an optimization of the ratio of the spacing between the regions and their depth. The optimum is a low ratio.

According to a preferred embodiment of the invention the method comprises the further steps of: 4) etching a trench from above into the drift layer at locations where the emitter layer regions are to be formed before carrying out step 2), and the p-type dopants are in step 2) introduced into at least the bottom of the trench to form the emitter layer regions. Thanks to the formation of such a trench it is possible to obtain a vertical distance of the Schottky contact and the emitter layer regions adjacent thereto as large as desired, so that the distance between two such adjacent trenches may be comparatively large avoiding the requirement of high resolution of implanted regions for efficient shielding of the Schottky regions. Thus, the lithographic and masking resolution does not have to be high.

According to another preferred embodiment of the invention the p-type dopants are in step 2) implanted by using an acceleration energy exceeding 1 MeV. The use of such a high implantation energy will lead to the same result as etching of a trench, since a lower lithographic and masking resolution may be accepted when such high energies are used than if the implantation was carried out at conventional energies, such as 300 keV, entailing sub-micron resolution of the implanted regions for efficient shielding of the Schottky regions.

According to another preferred embodiment of the invention the method further comprises the step of: 5) epitaxially regrowing a further low doped n-type second part of the drift layer on top of a first drift layer part grown in step 1) and on top of the emitter layer regions after carrying out step 2), and a trench is after step 5) but before step 3) etched into the second drift layer part close to at least one of the emitter layer regions for allowing the metal layer to form an ohmic contact thereto through step 3). By using this regrowth technique the implantation may be carried out at comparatively low voltages without any need for high resolution in the lithography, since the Schottky contact region between two adjacent emitter layer regions may be given a comparatively large lateral extension, but the emitter layer regions may nevertheless be positioned comparatively close to each other for efficiently pinching off the Schottky region.

According to another preferred embodiment of the invention the emitter layer regions are created through the introduction in step 2) as laterally extending bars crossing each other and forming a bar pattern, and in step 3) the metal layer is applied on top of the bar pattern to form an ohmic contact thereto at selected locations. The formation of such a bar pattern will make it possible to establish the ohmic contact at locations having a comparatively large mutual distance making the requirements of the processing steps lower.

Further preferred characteristics and advantages of the invention will appear from the following description and the other dependent claims.

BRIEF DESCRIPTION OF THE DRAWINGS

With reference to the appended drawings, below follows a specific description of preferred embodiments of the invention cited as examples.

In the drawings.

DETAILED DESCRIPTION OF PREFERRED EMBODIMENTS

Figure 1:
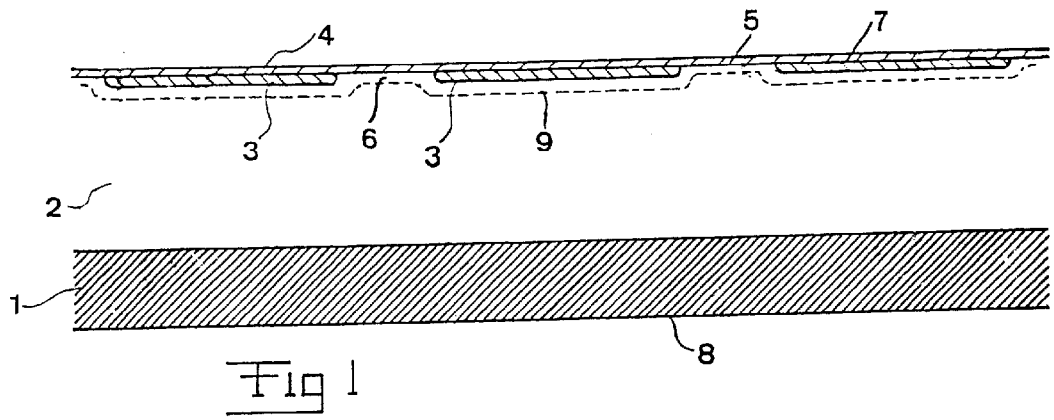
FIG. 1 is a schematic cross-section view of a Junction Barrier Schottky diode (JBS) according to a first preferred embodiment of the invention.

A Junction Barrier Schottky diode made of SiC is schematically illustrated in FIG. 1. However, it should be noted that the relative dimensions of the regions in the device shown in this figure have only been chosen for the sake of clearly of the drawing.

The constitution of this diode will be clear from the following description of the method according to the invention used for its production. This method also comprises masking and demasking steps as well as annealing step after implantation, which however have nothing to do with the invention, and thus will not be further described here. First a highly doped n-type substrate layer 1 and a low doped n-type drift layer 2 of SiC are epitaxially grown, preferably by Chemical Vapor Deposition, on top of each other. Any suitable donor, such as nitrogen and phosphor, may be used to obtain the doping of these layers. Typical doping concentrations may be $10^{15}$–$10^{16}$cm$^{-3}$ and $10^{18}$–$10^{20}$cm$^{-3}$ for the drift layer and the substrate layer, respectively. After applying a suitable mask on top of the drift layer and appropriate patterning thereof a p-type dopant, such as boron or aluminium, is implanted into the drift layer in regions 3 laterally spaced to form highly doped p-type emitter layer regions in the drift layer at a vertical distance from the substrate layer 1. In the case illustrated in FIG. 1 a conventional acceleration energy for the implant is used, such as 300 keV, which results in comparatively shallow emitter layer regions having a depth of about 0,3 μm when Al is implanted and 0,6 μm for B, which is to be compared with the thickness of the drift layer 2, which is typically about 10–50 μm. The doping concentration in the emitter layer regions may typically be $10^{16}$–$10^{20}$cm$^{-3}$.

After an annealing step for making the implanted dopants electrically active and removal of the mask used, a metal layer 4 is applied on top of the drift layer 2 to make a Schottky contact 5 thereto in regions 6 between adjacent emitter layer regions and on top of the emitter layer regions 3 to make an ohmic contact 7 thereto. The ohmic contact and the Schottky contact form the anode of the diode, whereas a corresponding metal layer only indicated by line 8 forms the cathode of the diode and is applied under the substrate layer.

The function of this device is certainly clear from above, but it will be briefly repeated. In the forward conducting state of the diode it will do to the lower Schottky barrier (about 0,7–1 V) than the pn-barrier (about 2,2–2,5 V) function as a Schottky diode at lower current densities, so that the on-state losses will be lower than for a pn-diode. There will also at such lower current densities be no injection of minority charge carriers from the emitter layer regions into the drift layer, which means that switching losses due to reverse recovery charge will be negligible. At higher current densities minority charge carriers will be injected from the emitter layer regions into the drift layer and the characteristic of the diode will come closer to that of a pn-diode. This is an advantage for the surge current capability of the device. In the reverse blocking state of the diode, accordingly, when the metal layer 4 is connected to a negative potential, the emitter layer regions will due to the low doping of the drift layer regions 6 easily deplete them and form a continuous depleted region therebetween, as indicated by the dashed line 9. This means that the diode will get the character of a conventional pn-diode and the field concentrations will be at the pn-junction and kept away from the Schottky contact 5. Thus, this diode will have a much lower leakage current at high voltages than a conventional Schottky diode. The doping concentration in the drift layer regions 2 and 6 may be varied continuously, so that the doping concentration is reduced when the distance to the surface is reduced. This facilitates spreading of the depleted reigon into the low doped region. The result will be a larger depleted region closest to the surface, making the shielding of the Schottky-contact easier, since a depleted region extending between the p-islands is formed earlier, i.e. at a lower voltage.

Figure 2:
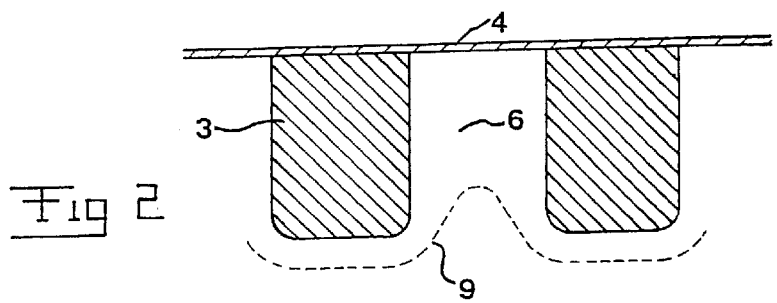
FIG. 2 is a view of the regions of a JBS in which the Schottky contact and the ohmic contact are formed according to a second preferred embodiment of the invention.

FIG. 2 illustrates how a diode according to a second preferred embodiment of the invention may look, and this diode has only one difference with respect to the diode according to FIG. 1, namely that a higher energy, about 4 MeV, has been used for implanting the p-type dopants to form the emitter layer regions 3. Of course not only one energy is used, but the implantation is carried out while using different energies, for instance from 300 keV to 4 MeV to obtain a box-like doping profile, which means a high doping concentration from the surface and deep thereunder. This means that the emitter layer regions will be much deeper, namely about 3 μm for B and 2 μm for Al, so that it is possible to arrange them more spaced apart, so that the resolution of lithography and masking required will be within a convenient range (in the order of 3 μm). The method described with reference to FIG. 1 would require a sub-micron resolution. The reason for the possibility of the greater distance between adjacent emitter layer regions 3 is that it will be easier to pinch off the Schottky contact region by depletion of the drift layer and separate the high electric fields from the Schottky contact region in the blocking state of the diode than if the emitter layer regions were shallower.

Figure 3:
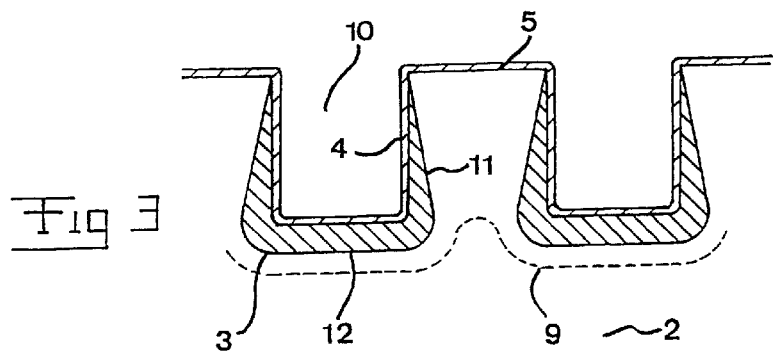
FIG. 3 is a view corresponding to FIG. 2 of the regions of a JBS according to a third preferred embodiment of the invention.

FIG. 3 illustrates how a diode according to a third preferred embodiment of the invention may be produced by etching a trench 10 from above into the drift layer 2 at locations where emitter layer regions are to be formed before carrying out the implantation step. Implantation is then carried out, so that emitter layer region 3 will be formed by the walls 11 and the bottom 12 of the trench. The metal layer is then applied in the trench and onto the drift layer region 6 between the trenches to form an ohmic contact 4 and a Schottky contact 5, respectively. This technique makes it possible to obtain the same advantages tages as in the embodiment shown in FIG. 2, but the depth of the emitter layer regions with respect to the Schottky contact regions may be selected arbitrarily without any need for high implantation energies.

Figure 4:
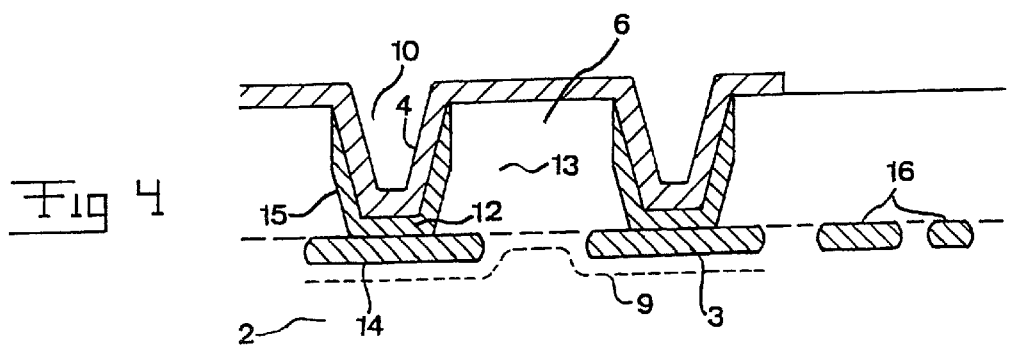
FIG. 4 is a view corresponding to FIG. 2 of the regions of a JBS according to a fourth preferred embodiment of the invention.

A fourth preferred embodiment of the invention is illustrated in FIG. 4, and in this method implantations are carried out to form emitter layer regions being comparatively shallow in the drift layer 2. This is followed by the step of epitaxially regrowing a further low doped n-type second part 13 of the drift layer on top of the first drift layer 2 and on top of the emitter layer regions 3. Trenches 10 are then etched into the second drift layer part 13 close to the emitter layer regions 3. An implantation is then carried out into the trenches as in the method described with reference to FIG. 3 to form highly doped p-type walls and bottom of the trench, so that the bottom p-type doping of the trench so formed will reach to and join the respective emitter layer region 3 formed in the first drift layer part 2 to form a continuous emitter layer region having two sub-regions 14 and 15. It would also be possible to dope only the bottom of the trench. The advantage with this technique is that it is possible to arrange the emitter layer sub-regions 14 not far away from each other, but still obtain a Schottky contact having a large lateral extension therebetween. This is an advantage with respect to lithographic and masking resolution requirements. It is also shown how highly doped p-type layers 16 may be buried in this way for taking field concentrations away from the periphery of the diode.

Figure 5:
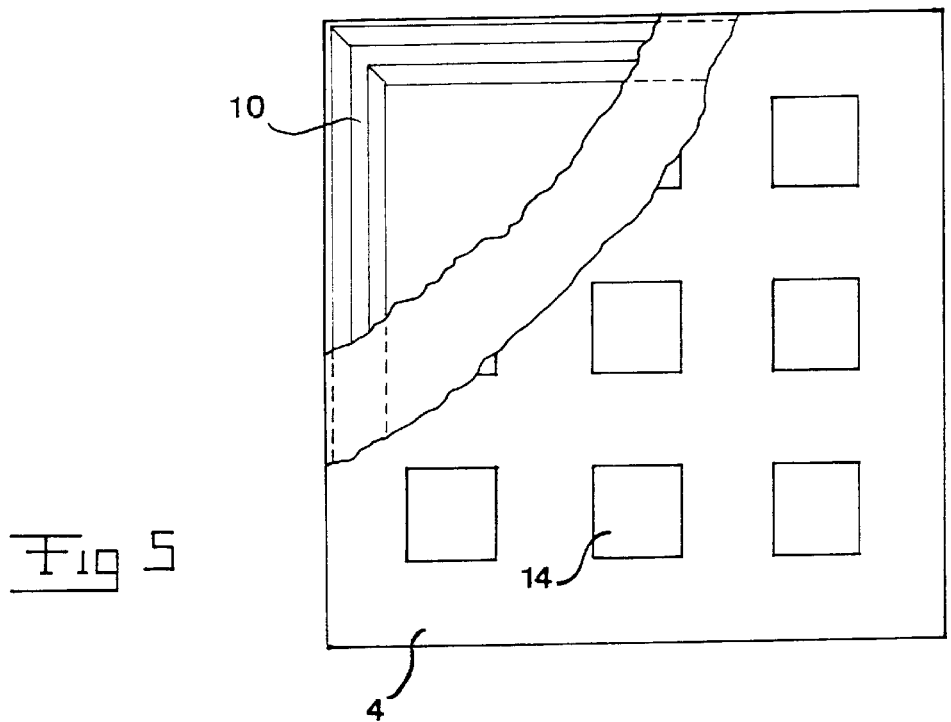
FIG. 5 is a view from above of a JBS according to a fifth preferred embodiment of the invention, in which portions have been broken away for illustrating the structure of the device.
Figure 6:
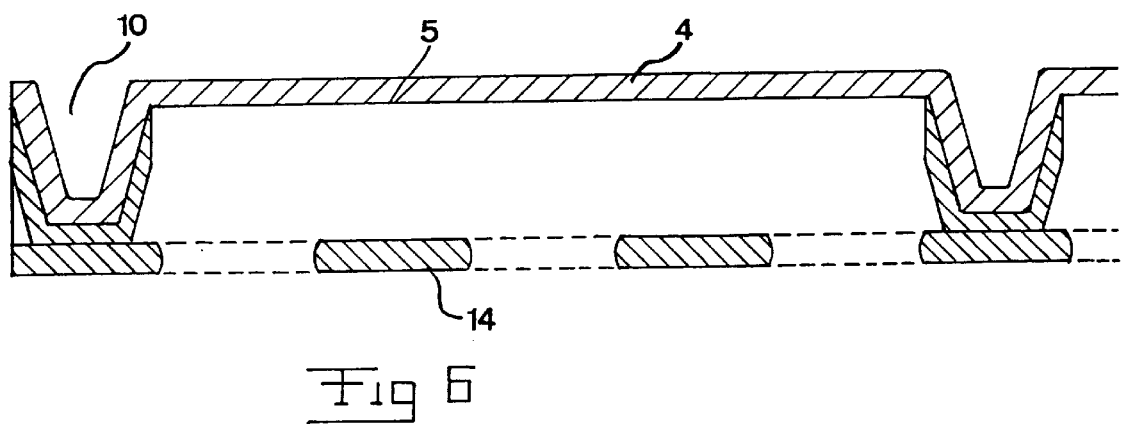
FIG. 6 is a view corresponding to FIG. 2 of the diode according to FIG. 5.

FIGS. 5 and 6 illustrate schematically a fifth preferred embodiment of the invention, in which a diode is produced in a similar way to the one described with reference to FIG. 4, but the emitter layer sub-regions 14 are created through the implantation as a laterally extending grid pattern. The different emitter layer regions are in this way in contact with each other by participating in forming the bar pattern, so it is only necessary to obtain an ohmic contact thereto at some selected locations for electrically connecting the metal layer 4 to all the emitter layer regions. As a consequence of this, it is illustrated in FIG. 5 how a trench 10 corresponding to the trenches in FIG. 4 is etched into the drift layer region to obtain a framelike structure extending close to the periphery of the bar pattern. This will make the manufacturing process simpler. FIG. 5 illustrates in the upper left corner how the device looks as viewed from above, the following strip illustrates a horizontal cut between the metal layer 4 and the bars 14 and the rest of the figure shows a horizontal cut through the bars. It is emphasized that the metal layer 4 may consist of two different metals, one metal for the contact to the Schottky region and another metal adapted to form a good ohmic contact to the p+ emitter region layers in the trenches.

The invention is of course not in any way restricted to the preferred embodiments described above, but many possibilities of modifications thereof will be apparent to a man with ordinarily skilled in the art without departing from the basic idea of the invention.

The number of layers mentioned in the claims is a minimum number, and it is within the scope of the invention to arrange further layers in the devices or dividing any layer into several layers by selective doping of different regions thereof. Especially the drift layer may be composed by sub-layers of different doping concentrations, such as particularly low doping concentration close to the emitter layer regions for facilitating the depletion of the drift layer there. It is for instance also possible to arrange a highly doped buffer layer between the substrate and the drift layer. This buffer layer will have the same conductivity doping type, n or p, as the drift layer.

"Substrate layer" is in this disclosure to be interpreted as the layer closest to the cathode of the layers mentioned and it has not to be a substrate layer in the strict sense of this word within this field, i.e. the layer from which the growth is started. The real substrate layer may be any of the layers and is mostly the thickest one, which may be the drift layer. The definition "Epitaxially growing on top of each other . . . substrate layer" in the claims and in the description comprises also the case in which the epitaxial growth is started by growing on top of a sub-strate disc. However, the very substrate does not have to be grown epitaxially.

The bar pattern or grid idea illustrated in FIGS. 5 and 6 may be modified by other net designs, such as squares, rectangles, hexagonal structures and so on. A "finger structure" would also be possible.

The method claims are to be interpreted as not restricted to a growth of the layers located on top of each other in the order they are mentioned, but any other order of growth of these layers is within the scope of the claims. For instance, the method may be started from the drift layer and the so called substrate layer and the cathode may be grown at the very end of the method.

We claim:

1. A Schottky diode having on top of each other in the order mentioned:

a substrate layer of a first conductivity type, n or p, and having a high doping concentration, a drift layer of said first conductivity type and having a low doping concentration, both layers made of SiC, a metal layer making a Schottky contact to said drift layer, emitter layer regions of a second conductivity type, opposite to said first conductivity type and having a high doping concentration, said emitter layer regions being formed in said drift layer at a vertical distance from said substrate layer and making an ohmic contact to said metal layer, said emitter layer regions being laterally separated from each other by drift layer regions and are formed of highly doped bars extending substantially laterally in substantially the same plane and crossing each other to form a grid pattern, said grid pattern being buried in said drift layer at a vertical distance to Schottky contacts of the diode, and at least one trench is etched into the drift layer to obtain a metal top of one emitter layer region and thereby an ohmic contact of the metal to all emitter layer regions;

wherein doping concentrations of the drift layer and the emitter layer regions, depths of the emitter layer regions with respect to a location of the Schottky contact between two adjacent emitter layer regions and lateral distance therebetween are selected to allow a depletion of the drift layer in the blocking state form a continuous depleted region between the emitter layer regions, thereby screening off high electrical field at a Schottky junction, so as not to be exposed to high electrical field.

2. A diode according to claim 1, wherein the emitter layer region forms a bottom of the trench, and wherein said metal layer forms the ohmic contact to said emitter layer region at the bottom of the trench creating a vertical distance between the Schottky contact next to said emitter layer region and the ohmic contact to said emitter layer region in the bottom of the trench.

3. A diode according to claim 2, further comprising a trench etched into said drift layer for each emitter layer region formed in the drift layer.

4. A diode according to claim 2, wherein said emitter layer region forms the bottom and the walls of said trench.

5. A diode according to claim 2, wherein said emitter layer region extends further laterally than the bottom of the trench at least in one direction.

6. A diode according to claim 1, further comprising a plurality of said trenches arranged at selected locations to form ohmic contacts to said emitter layer region grid pattern at these locations.

7. A diode according to claim 1, wherein said trench has a substantially continuous extension forming a frame extending close to a periphery of said grid pattern.

8. A diode according to claim 1, wherein said first conductivity doping type is n.

9. A diode according to claim 1, wherein the doping concentration in the drift layer is reduced with a reduced distance to a surface thereof next to the metal layer.

10. A diode according to claim 5, further comprising an emitter layer sub-region at a vertical distance from the bottom of the trench extending further laterally at least in one direction than the bottom of the trench.

* * * * *